US009869114B1

(12) United States Patent
Hung et al.

(10) Patent No.: US 9,869,114 B1
(45) Date of Patent: Jan. 16, 2018

(54) HINGE ASSEMBLY FOR ELECTRONIC DEVICE

(71) Applicant: SHIN ZU SHING CO., LTD., New Taipei (TW)

(72) Inventors: Shin Yu Hung, New Taipei (TW); Jui Lin Chu, New Taipei (TW)

(73) Assignee: SHIN ZU SHING CO., LTD., New Taipei (TW)

( * ) Notice: Subject to any disclaimer, the term of this patent is extended or adjusted under 35 U.S.C. 154(b) by 0 days.

(21) Appl. No.: 15/229,272

(22) Filed: Aug. 5, 2016

(51) Int. Cl.
*E05D 3/06* (2006.01)
*E05D 15/00* (2006.01)
*E05D 3/18* (2006.01)
*E05D 11/08* (2006.01)
*H05K 5/02* (2006.01)

(52) U.S. Cl.
CPC .............. *E05D 3/18* (2013.01); *E05D 11/08* (2013.01); *H05K 5/0226* (2013.01); *E05Y 2900/606* (2013.01)

(58) Field of Classification Search
CPC ...... G06F 1/168; G06F 1/1681; G06F 1/1616; G06F 1/547; E05Y 2900/602; E05Y 2900/606; H04M 1/022; H04M 1/0214; H04M 1/0216; H05K 5/0226; E05D 3/12; E05D 3/122; E05D 3/14; E05D 3/16; E05D 3/06; E05D 3/18; E05D 11/06; E05D 11/08; Y10T 16/547; Y10T 16/5474; Y10T 16/5475; Y10T 16/541
See application file for complete search history.

(56) References Cited

U.S. PATENT DOCUMENTS 7,203,997 B2 * 4/2007 Morgan .................... E05D 3/18
108/67
8,776,319 B1 * 7/2014 Chang ................... G06F 1/1681
16/303

(Continued)

FOREIGN PATENT DOCUMENTS

TW M519688 U 4/2016

*Primary Examiner* — Chuck Mah
(74) *Attorney, Agent, or Firm* — Alan D. Kamrath; Kamrath IP Lawfirm, P.A.

(57) ABSTRACT

A hinge assembly for an electronic device includes a joint assembly including joint components hinged one by one. Each joint component includes a first plate, a second plate, and a link component disposed between the first and second plates. Each of the first and second plates has two first slots diametrically extending in a first direction. The first plate has a second slot disposed between the two first slots and diametrically extending in a second direction different from the first direction. The second plate has a third slot disposed between the two first slots and diametrically extending in a third direction mirror-symmetrical to the second direction with respect to the first direction. The link component has an engaging hole and a guide portion. The engaging hole is corresponding to one of the first slots of each of the first and second plates, and the guide portion is formed on a surface of the link component and movable within the second or third slot. Movement of the guide portion causes the link component to move, and the engaging hole moves corresponding to the one of the first slots of each of the first and second plates along the first direction, thus changing an axial distance between the shafts.

8 Claims, 14 Drawing Sheets

(56) References Cited

U.S. PATENT DOCUMENTS

| | | |
|---|---|---|
| 8,971,032 B2 | 3/2015 | Griffin et al. |
| 8,999,474 B2 | 4/2015 | Casteras |
| 9,013,884 B2 | 4/2015 | Fukuma et al. |
| 9,021,657 B2 | 5/2015 | Park et al. |
| 9,047,055 B2 | 6/2015 | Song |
| 9,173,287 B1 * | 10/2015 | Kim .................. H05K 1/028 |
| 2007/0117600 A1 * | 5/2007 | Robertson, Jr. ..... H04M 1/0216 455/575.3 |
| 2014/0126133 A1 * | 5/2014 | Griffin .................. G06F 1/1652 361/679.27 |
| 2014/0174226 A1 * | 6/2014 | Hsu ..................... E05D 3/122 74/98 |
| 2015/0176317 A1 * | 6/2015 | Lee ...................... E05D 3/06 16/251 |
| 2015/0361696 A1 * | 12/2015 | Tazbaz ................. H04M 1/022 361/679.27 |
| 2016/0116944 A1 * | 4/2016 | Lee ...................... H04M 1/022 361/679.26 |
| 2016/0179236 A1 * | 6/2016 | Shin ..................... G06F 1/1616 345/173 |
| 2016/0224072 A1 * | 8/2016 | Huang ................... E05D 7/06 |

\* cited by examiner

HINGE ASSEMBLY FOR ELECTRONIC DEVICE

BACKGROUND OF THE INVENTION

1. Field of the Invention

The present invention relates to a hinge assembly for an electronic device. More particularly, the present invention relates to a hinge assembly for a flip-type or flexible electronic device, capable of changing axial distances between shafts.

2. Description of the Prior Art

A conventional flip-type or flexible electronic device, for example disclosed in Taiwan Patent No. M519688, uses a hinge assembly capable of changing axial distances between shafts so that the electronic device does not buckle when flipping or bending. However, the structure of the conventional hinge assembly is very complicated, resulting in higher cost of manufacture, larger size, and higher weight.

SUMMARY OF THE INVENTION

The present invention provides a hinge assembly for an electronic device, capable of changing axial distances between shafts and not buckling when flipping or bending.

According to an aspect of the present invention, there is provided a hinge assembly for an electronic device. The hinge assembly includes a joint assembly including joint components hinged one by one. Each joint component includes a first plate, a second plate, and a link component disposed between the first and second plates. Each of the first and second plates has two first slots diametrically extending in a first direction. The first plate has a second slot disposed between the two first slots and diametrically extending in a second direction different from the first direction. The second plate has a third slot disposed between the two first slots and diametrically extending in a third direction mirror-symmetrical to the second direction with respect to the first direction. The link component has an engaging hole and a guide portion. The engaging hole is corresponding to one of the first slots of each of the first and second plates, and the guide portion is formed on a surface of the link component and movable within the second or third slot. Movement of the guide portion causes the link component to move, and the engaging hole moves corresponding to the one of the first slots of each of the first and second plates along the first direction.

According to another aspect of the present invention, each joint component further includes a support component disposed between the plates. The support component has a non-engaging hole corresponding to another of the first slots of each plate.

According to another aspect of the present invention, the joint assembly further includes shafts passing through the first slots, the link component, and the support component so that the joint components are hinged through the shafts.

According to another aspect of the present invention, movement of the link component causes a corresponding shaft to move within the one of the first slots of each plate to change an axial distance between the shafts.

According to another aspect of the present invention, the engaging hole is a non-circular hole, and the shafts are non-circular shafts corresponding to the engaging hole.

According to another aspect of the present invention, the joint assembly further includes torque generation components disposed at ends of the shafts.

According to another aspect of the present invention, the link component has a body portion and an arm portion extending from a side of the body portion. The engaging hole is formed in the body portion, and the guide portion is formed on a side of the arm portion.

According to another aspect of the present invention, the arm portion has a through hole, and the guide portion is a cylinder corresponding to the through hole. The guide portion is inserted into the through hole to combine with the arm portion.

According to another aspect of the present invention, the hinge assembly further includes a fixing bracket disposed at a side of the joint assembly for combining the hinge assembly with the electronic device.

According to another aspect of the present invention, the fixing bracket has a fixing structure for fixing the fixing bracket to the electronic device.

According to another aspect of the present invention, the electronic device includes a flip-type or flexible electronic device.

By the two first slots and the second slot extending in different directions, and the guide portion movable within the second slot, the shafts may change the axial distance therebetween while rotating, so that the electronic device using the hinge assembly does not buckle when flipping or bending. Moreover, the structure of the hinge assembly is simple, resulting in lower cost of manufacture, smaller size, and lower weight.

DESCRIPTION OF THE PREFERRED EMBODIMENTS

Figure 1:
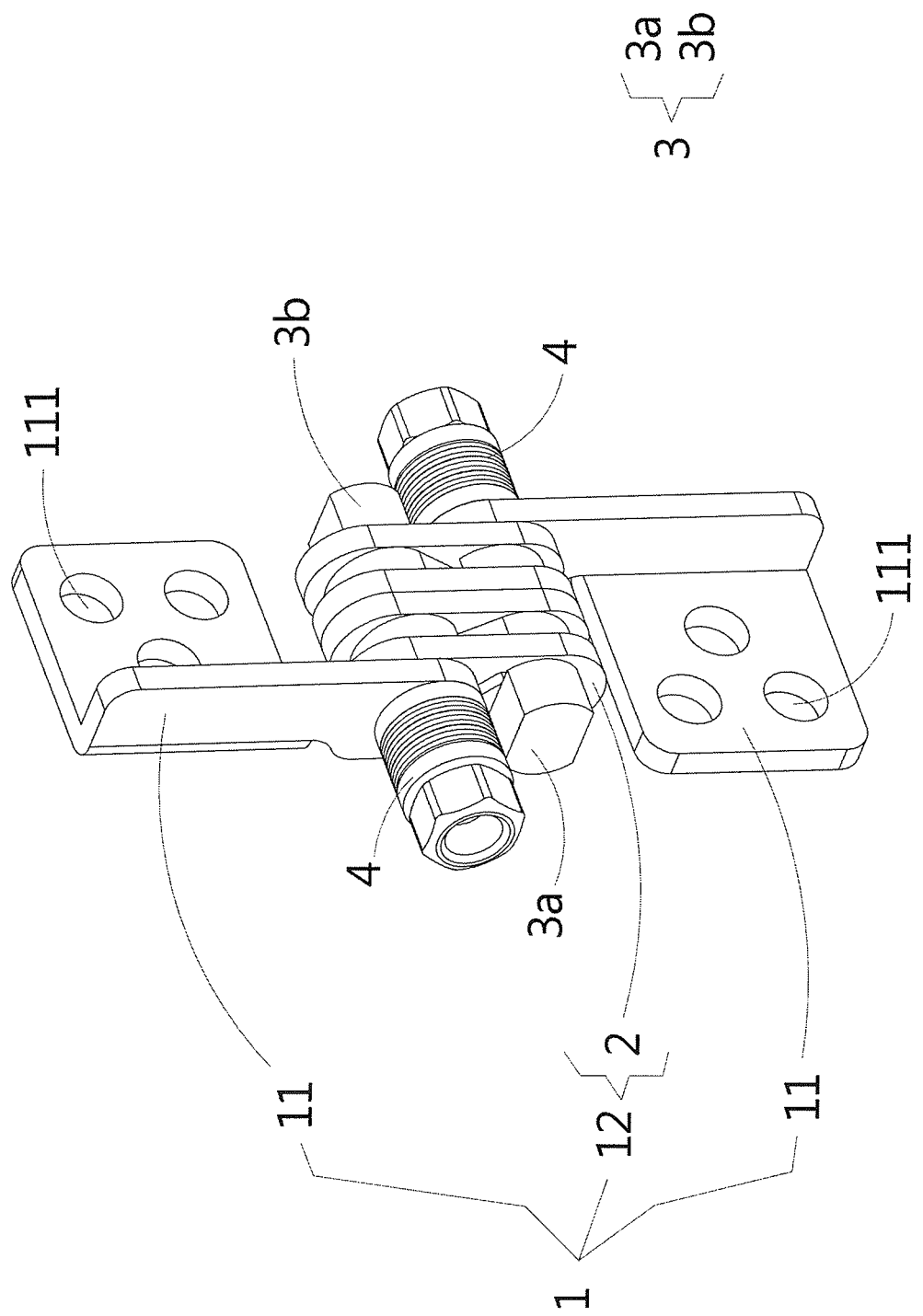
FIG. 1, FIG. 2, and FIG. 2A are an assembled view, a partially exploded view, and an exploded view of a hinge assembly according to an embodiment of the present invention, respectively.

Reference will now be made in detail to several embodiments of the present invention that are illustrated in the accompanying drawings. Wherever possible, same or similar reference numerals are used in the drawings and the description to refer to the same or like components. For purposes of convenience and clarity only, directional terms, such as up, down, left, right, front, and rear may be used with respect to the drawings. These and similar directional terms should not be construed to limit the scope of the present invention in any manner.

Figure 2:
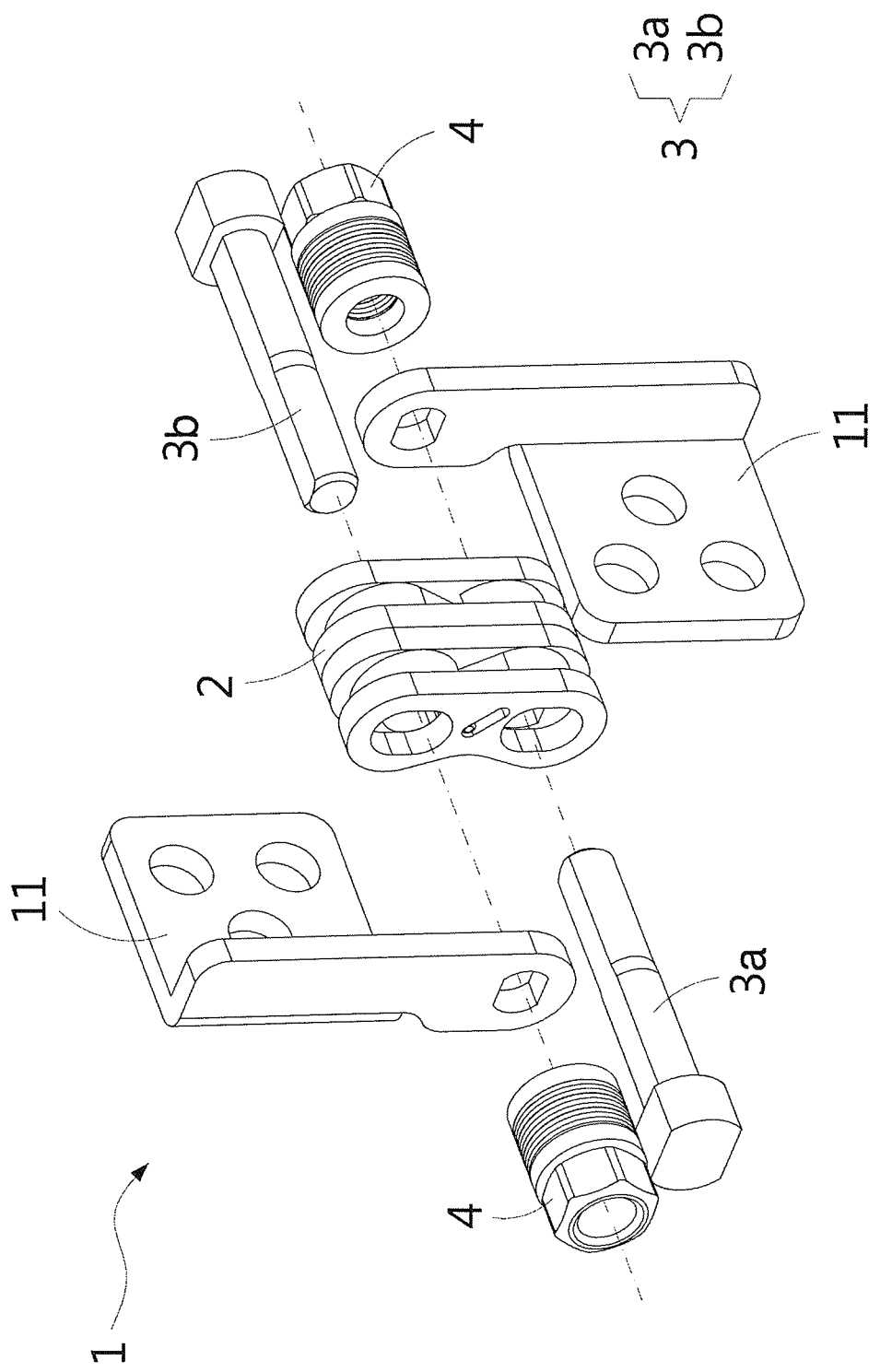
Figure 2A:
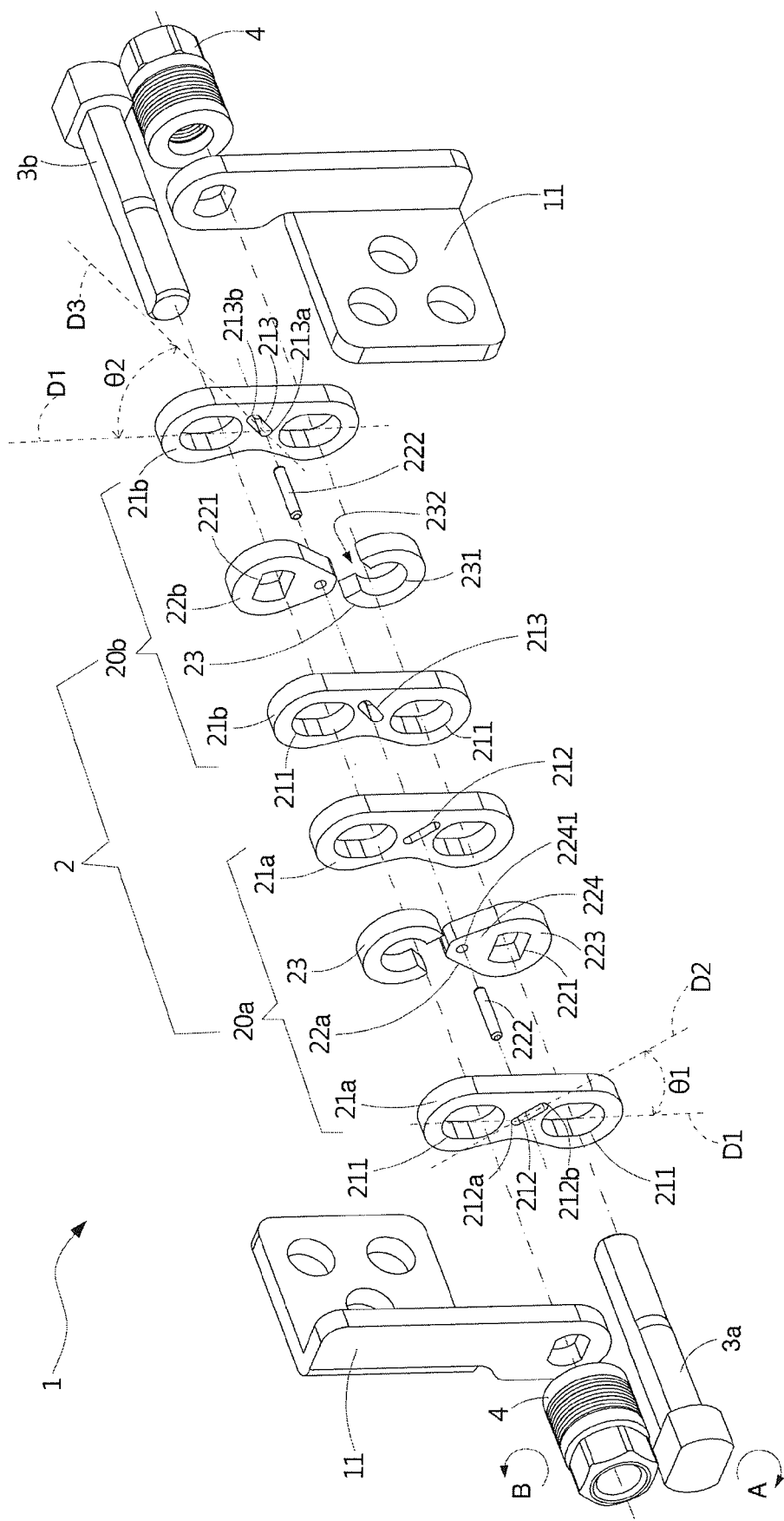

Referring to FIG. 1, FIG. 2, and FIG. 2A, there are shown an assembled view, a partially exploded view, and an exploded view of a hinge assembly 1 according to an embodiment of the present invention, respectively. The hinge assembly 1 is used for an electronic device (not shown). The electronic device may include a flip-type or flexible electronic device such as a flip-type or flexible display. The hinge assembly 1 includes a joint assembly 12 and two fixing brackets 11. In the embodiment, the joint assembly 12 includes a joint component 2, two shafts 3 (including a first shaft 3a and a second shaft 3b), and two torque generation components 4 respectively disposed at ends of the shafts 3.

The joint component 2 includes two component groups 20a and 20b. The component group 20a includes two first plates 21a, a first link component 22a, and a support component 23, wherein the first link component 22a and the support component 23 are disposed between the two first plates 21a. The component group 20b includes two second plates 21b, a second link component 22b, and a support component 23, wherein the second link component 22b and the support component 23 are disposed between the two second plates 21b. It should be noted that each of the support components 23 is clamped between the two first plates 21a or between the two second plates 21b so as to stabilize the hinge assembly when the first shaft 3a and the second shaft 3b are rotated. Without the support component 23, the two first plates 21a (or second plates 21b) only clamping the first link component 22a (or second link component 22b) and leaving a blank space above the first link component 22a (or leaving a blank space below the second link component 22b) will cause the hinge assembly to be unsteady when the hinge assembly works. However, the support components 23 can be integrally formed on one of the first plates 21a or the second plates 21b.

Each of the two first plates 21a and the two second plates 21b has two first slots 211 penetrating therethrough and diametrically extending in a first direction D1. Each first plate 21a has a second slot 212 disposed between the two first slots 211 and diametrically extending in a second direction D2, wherein the second direction D2 is different from the first direction D1 and has a tilted angle θ1 with respect to the first direction D1. Each second plate 21b has a third slot 213 disposed between the two first slots 211 and diametrically extending in a third direction D3 different from the first direction D1 and has a tilted angle θ2 with respect to the first direction D1, wherein the third direction D3 is mirror-symmetrical to the second direction D2 with respect to the first direction D1 so that the tilted angle θ1 equals to the tilted angle θ2.

Each of the first link component 22a and the second link component 22b has an engaging hole 221 and a guide portion 222. The engaging hole 221 of the first link component 22a is corresponding to one of the two first slots 211 of each of the first plates 21a and the second plates 21b, and the guide portion 222 of the first link component 22a is formed on a surface of the first link component 22a and movable within the second slot 212. The engaging hole 221 of the second link component 22b is corresponding to the other of the two first slots 211 of each of the first plates 21a and the second plates 21b, and the guide portion 222 of the second link component 22b is formed on a surface of the second link component 22b and movable within the third slot 213.

The first shaft 3a passes through one of the two first slots 211 of each of the first plates 21a and the second plates 21b, and passes through the engaging hole 221 of the first link component 22a to engage with the first link component 22a. In this configuration, the first shaft 3a can drive the first link component 22a to rotate. The second shaft 3b passes through the other of the two first slots 211 of each of the first plates 21a and the second plates 21b, and passes through the engaging hole 221 of the second link component 22b to engage with the second link component 22b so that the second shaft 3b can drive the second link component 22b to rotate.

When the guide portion 222 of the first link component 22a moves within the second slot 212 along the second direction D2, the first link component 22a moves along the first direction D1 and rotates so that the first shaft 3a engaged with the engaging hole 221 of the first link component 22a moves within the first slot 211 along the first direction D1 and rotates and vice versa. When the guide portion 222 of the second link component 22b moves within the third slot 213 along the third direction D3, the second link component 22b moves along the first direction D1 and rotates so that the second shaft 3b engaged with the engaging hole 221 of the second link component 22b moves within the first slot 211 along the first direction D1 and rotates and vice versa. Because the third direction D3 is mirror-symmetrical to the second direction D2 with respect to the first direction D1, the first shaft 3a and the second shaft 3b respectively move along the first direction D1 inwardly or outwardly. Moreover, when the first shaft 3a rotates in a clockwise direction, the second shaft 3b rotates in a counterclockwise direction; when the first shaft 3a rotates in a counterclockwise direction, the second shaft 3b rotates in a clockwise direction.

Figure 3:
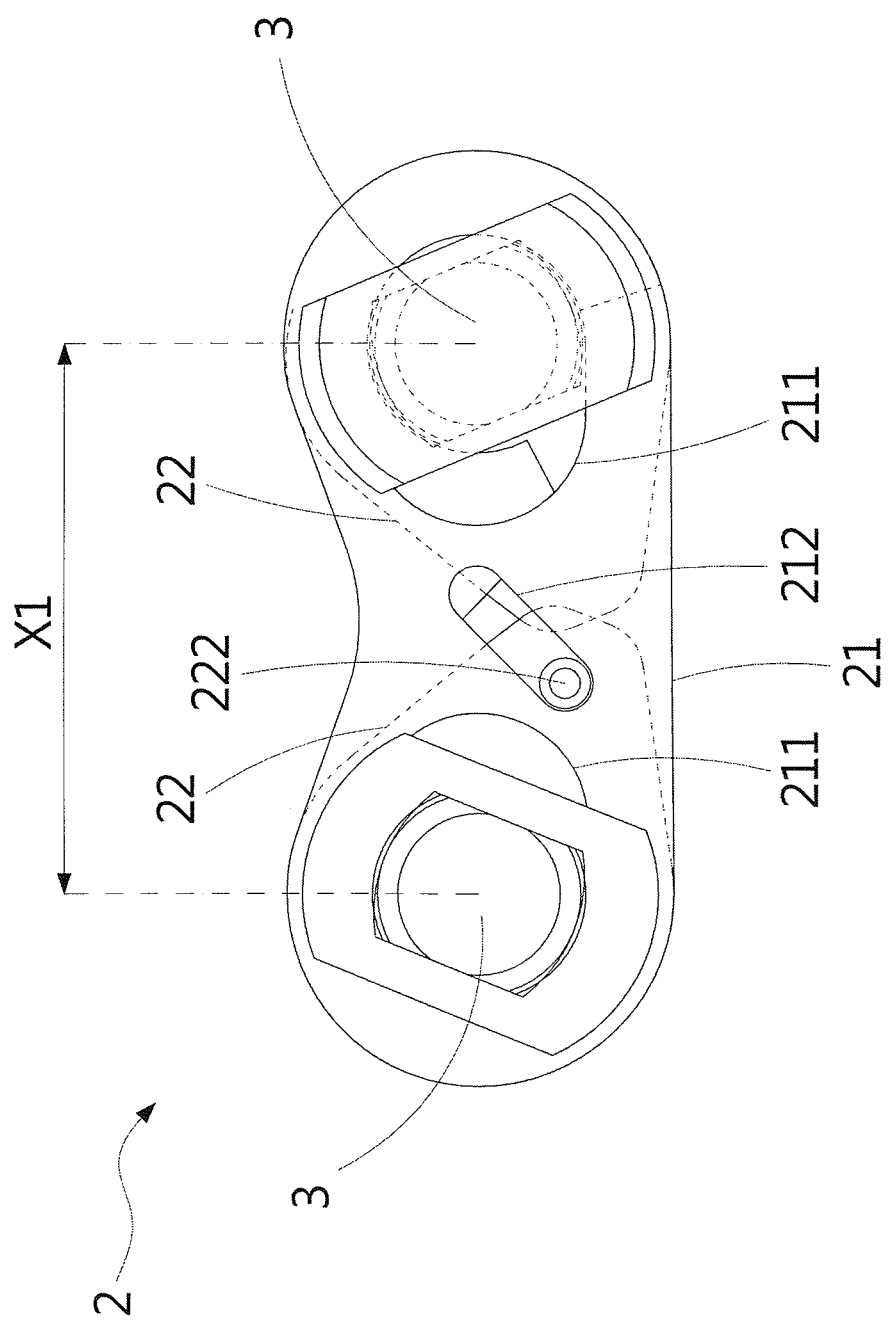
FIG. 3 and FIG. 4 are schematic views illustrating changes of an axial distance between shafts in a joint component according to an embodiment of the present invention, respectively.
Figure 4:
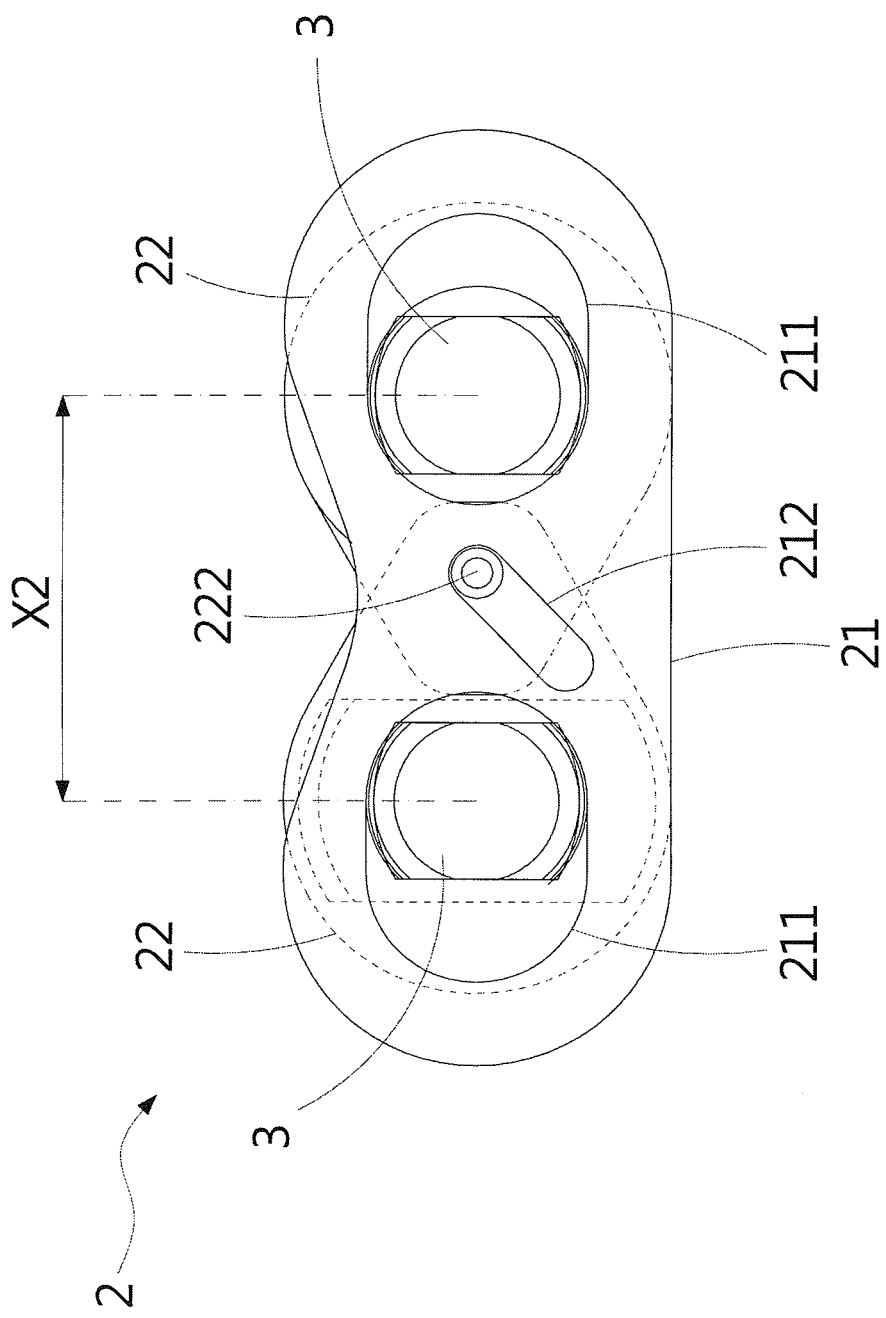

For example, referring to FIG. 2A, when the first shaft 3a rotates in a clockwise direction A, which makes the first link component 22a rotate accordingly, the guide portion 222 of the first link component 22a slides within the second slot 212 from one end 212a to the other end 212b of the second slot 212 so that the first shaft 3a slides within the corresponding first slot 211 outwardly or downwardly. Meanwhile, when the second shaft 3b rotates in a counterclockwise direction B, the guide portion 222 of the second link component 22b slides within the third slot 213 from one end 213a to the other end 213b of the third slot 213 so that the second shaft 3b slides within the corresponding first slot 211 outwardly or upwardly. In this configuration, when the two fixing brackets 11 are in the close state, (e.g. 0 degree), the two shafts 3a and 3b are in closer state and the two shafts 3a and 3b are with a shorter distance X2 as shown in FIG. 4; then, when a user exerts with one hand on one of the two fixing brackets 11 and the other hand on the other fixing brackets 11 to rotate and open the two fixing brackets 11, the two shafts 3a and 3b respectively move outwardly so that the two shafts are with a longer distance X1 as shown in FIG. 3.

It should be noted that how long the second slot 212 and the third slot 213 are and how tilted the angle θ1 of the second slot 212 (or the angle θ2 of the third slot 213) with respect to the first direction D1 will decide how far the distance of the two shafts 3a and 3b will be. The variation of lengths of the second slot 212 and the third slot 213 and the changed tilting angle of the second slot 212 and the third slot 213 with respect to the first direction D1 are obvious to those skilled in the art.

Because the hinge assembly is to be used in the flip-type or flexible electronic device having flexible display, the moving distance from X2 to X1 of only two shafts is very short and it does not fully meet the requirement when the hinge assembly with two shafts is applied on an electronic device. Therefore, more than two shafts with many joint components 2 including two component groups 20a and 20b will be discussed hereafter.

Figure 5:
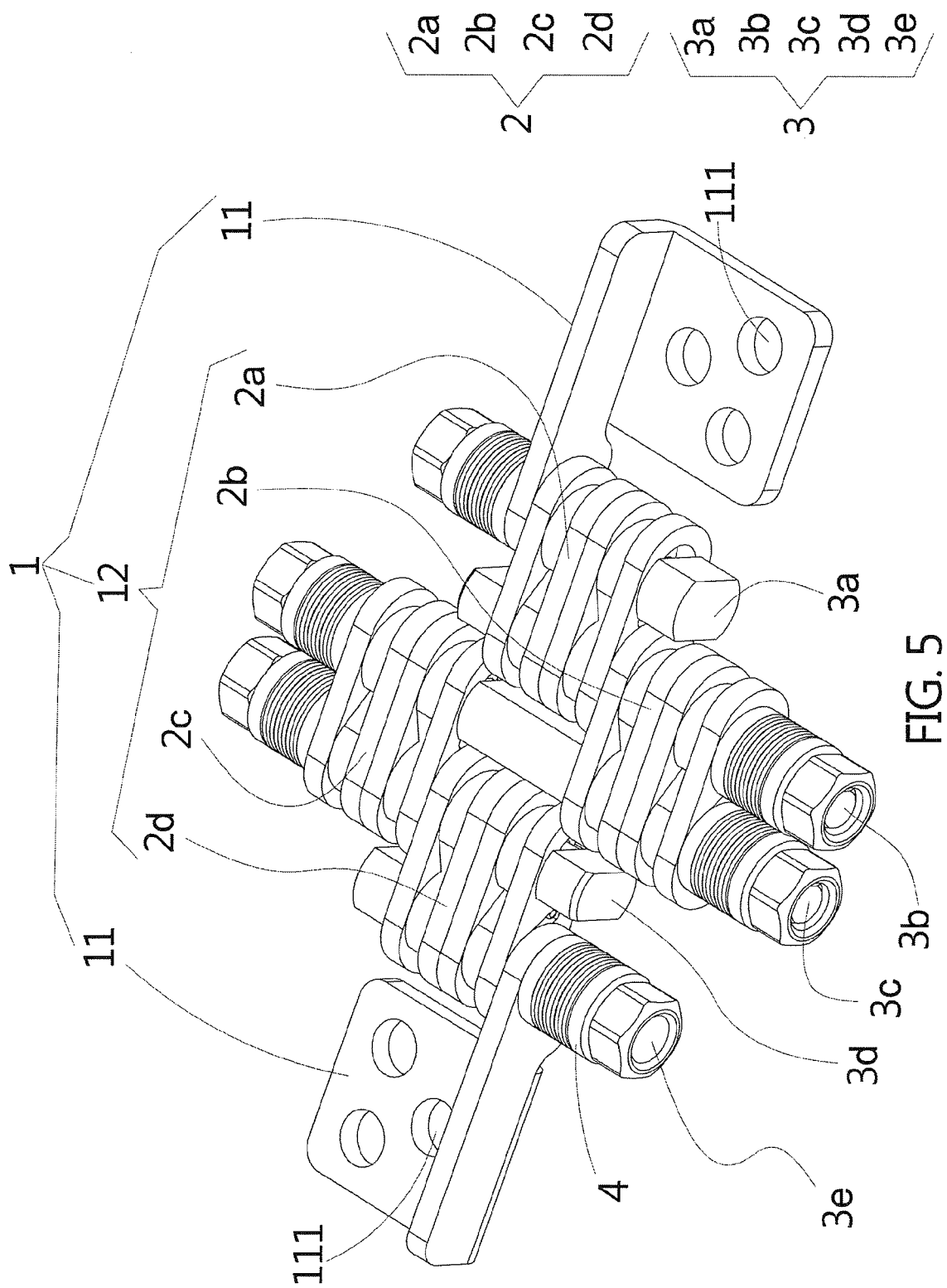
FIG. 5 and FIG. 6 are an assembled view and an exploded view of a hinge assembly according to another embodiment of the present invention, respectively.
Figure 6:
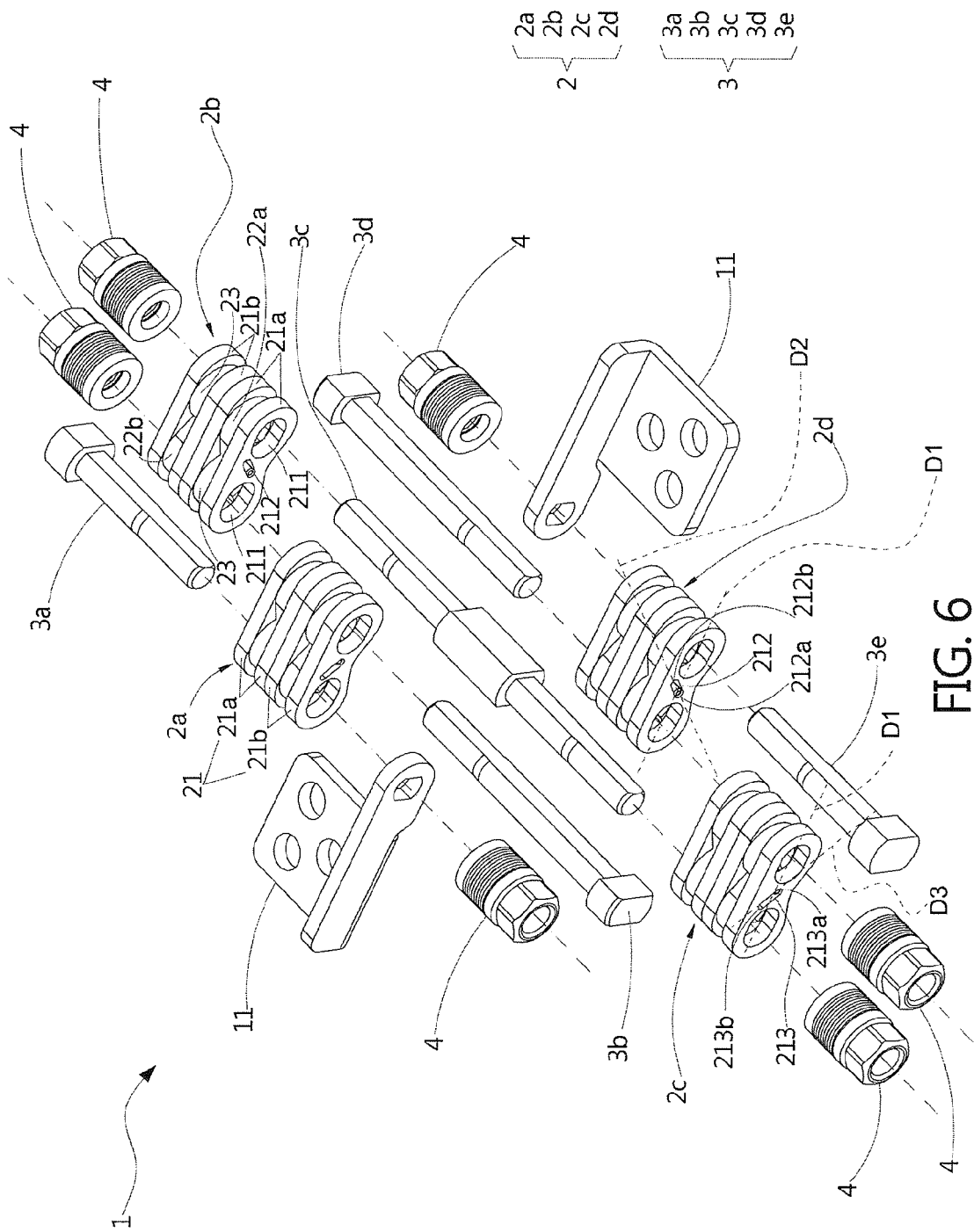

Referring to FIG. 5 and FIG. 6, there are shown an assembled view and an exploded view of a hinge assembly 1 according to an embodiment of the present invention, respectively. The hinge assembly 1 is used for an electronic device (not shown). The electronic device may include a flip-type or flexible electronic device such as a flip-type or flexible display. The hinge assembly 1 includes a joint assembly 12 and two fixing brackets 11 disposed at two opposite sides of the joint assembly 12.

The joint assembly 12 includes joint components 2 hinged one by one, shafts 3, and torque generation components 4 disposed at ends of the shafts 3. In the embodiment, the joint assembly 12 includes four joint components 2a, 2b, 2c and 2d, and five shafts 3a, 3b, 3c, 3d and 3e. The joint component 2a is hinged to the joint component 2b through the shaft 3b, the joint component 2b is further hinged to the joint component 2c through the shaft 3c, and the joint component 2c is further hinged to the joint component 2d through the shaft 3d. In other words, the joint components 2a, 2b, 2c and 2d are hinged one by one through the shafts 3b, 3c, and 3d.

Each fixing bracket 11 has a fixing structure 111 for fixing the fixing bracket 11 to the electronic device and thus causing the hinge assembly 1 to combine with the electronic device. In the embodiment, one fixing bracket 11 is fixed to the shaft 3a to which the joint component 2a is further hinged, and the other fixing bracket 11 is fixed to the shaft 3e to which the joint component 2d is further hinged.

The joint component 2 includes two component groups 20. Each component group 20 here is like what is mentioned in FIG. 2A and further includes two plates 21, a link component 22, and a support component 23. The link component 22 and the support component 23 are disposed between the two plates 21.

That is to say, please compare between FIG. 2A and FIG. 6, the joint component 2b in FIG. 6 is exactly the same one as the joint component 2 in FIG. 2A. It should be noted from the FIG. 6 that the joint component 2b and 2d have the same configuration, which means that the second slots 212 of the joint component 2b and 2d tilt along the second direction D2, and the first plates 21a having the second slots 212 are located in the front of the joint component while the second plates 21b having the third slots 213 are located in the rear of the joint component.

Figure 6A:
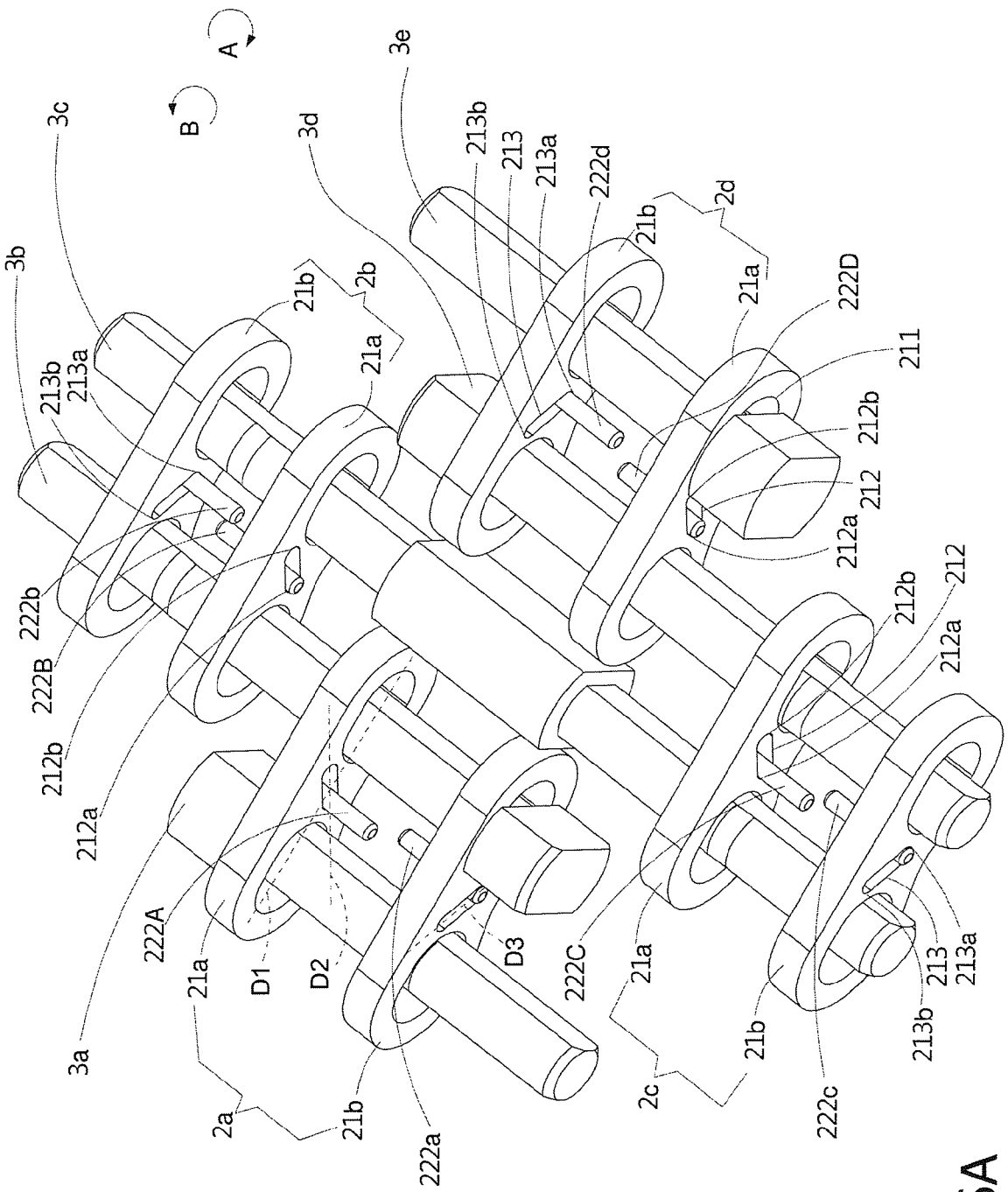
FIG. 6A is a schematic view of the hinge assembly of FIG. 6.

However, in order to achieve the function of making each of the shafts 3a, 3b, 3c, 3d and 3e move outwardly while the hinge assembly is bent, the joint components 2a and 2c have the same configuration different from the configuration of the joint components 2b and 2d, which means that the first plates 21a of the joint components 2a and 2c are disposed in the rear of the joint component while the second plates 21b are disposed in the front of the joint component as shown in FIG. 6A. FIG. 6A is a schematic view of the hinge assembly 1 of FIG. 6, but one of the first plates 21a, one of the second plates 21b, the first link component 22a, the second link component 22b, and the support components 23 of each joint component 2 are omitted for clarification of the moving of the shafts 3a, 3b, 3c, 3d and 3e, and the moving of the shafts 3a, 3b, 3c, 3d and 3e will be discussed later.

As shown in FIG. 6, each plate 21 (e.g. 21a or 21b) has two first slots 211 and a second slot 212. The two first slots 211 extend in a first direction D1, and the second slot 212 extends in a second direction D2 different from the first direction D1.

Referring to FIG. 2A and FIG. 6, as it is mentioned that the joint component 2b in FIG. 6 equals to the joint component 2 in FIG. 2A, some numerals will be left out in FIG. 6 for simplicity. The link component 22 has an engaging hole 221 and a guide portion 222. The engaging hole 221 is corresponding to one of the two first slots 211 of each plate 21. The guide portion 222 is formed on a side of the link component 22 and movable within the second slot 212. In the embodiment, an extending size of the slot 211 is greater than that of the second slot 212, and, therefore, the second slot 212 may limit a distance of movement of the link component 22. In the embodiment, the link component 22 has a body portion 223 and an arm portion 224 extending from a side of the body portion 223. The engaging hole 221 is formed in the body portion 223, and the guide portion 222 is formed on a side of the arm portion 224. Specifically, the arm portion 224 has a through hole 2241, and the guide portion 222 is a cylinder corresponding to the through hole 2241. The guide portion (cylinder) 222 is inserted into the through hole 2241 to combine with the arm portion 224 so that the guide portion (cylinder) 222 is substantially formed on two opposite sides of the arm portion 224 and movable within the second slots 212 of the two plates 21. Moreover, in the embodiment, the engaging hole 221 is a non-circular hole, and the shafts 3 are non-circular shafts corresponding to the engaging hole 221.

Referring to FIG. 2A and FIG. 6, the support component 23 has a non-engaging hole 231 corresponding to another of the two first slots 211 of each plate 21. In the embodiment, the non-engaging hole 231 is a circular hole, and the support component 23 further has a cut-off portion 232 connected to the non-engaging hole (circular hole) 231 so that the support component 23 is C-shaped. As it is mentioned that each of the support components 23 clamped between the two first plates 21a or between the two second plates 21b is to stabilize the hinge assembly when the shafts 3a and 3b are rotated.

For each component group 20, the link component 22 and the support component 23 are disposed between the two plates 21, in which the engaging hole 221 of the link component 22 is corresponding to the one of the two first slots 211 of each plate 21, and the non-engaging hole 231 of the support component 23 is corresponding to the another of the two first slots 211 of each plate 21. One shaft 3 passes through the one of the two first slots 211 of each plate 21 and engages with the engaging hole 221 of the link component 22, and another shaft 3 passes through the another of the two first slots 211 of each plate 21 and the non-engaging hole 231 of the support component 23.

By the two first slots 211 and the second slot 212 extending in different directions D1 and D2, and the one shaft 3 moving within the one of the two first slots 211 of each plate 21 and engaging with the engaging hole 221 of the link component 22, movement of the guide portion 222 within the second slot 212 causes the link component 22 to move and rotate, and, moreover, the engaging hole 221 of the link component 22 moves corresponding to the one of the first slots 211 of each plate 21 along the first direction D1 and rotates. Movement of the link component 22 causes the one shaft 3 to move within the one of the two first slots 211 of each plate 21 to change an axial distance between the one shaft 3 and the another shaft 3.

Referring to FIG. 3 and FIG. 4, there are shown schematic views illustrating changes of an axial distance between the shafts 3 in the joint component 2 according to the embodiment of the present invention, respectively. The joint component 2 has two component groups (not labeled), each of which has a plate 21 having a second slot 212, and a link component 22 having a guide portion 222. In the drawings, because the two component groups symmetrically act, the guide portion 222 of the link component 22 in the right side is omitted for clarity, and the second slot 212 within which the omitted guide portion 222 moves is also omitted for clarity.

As shown in FIG. 3, the guide portion 222 moves to the leftmost, lowest position within the second slot 212, thus causing the link component 22 in the left side to move to the leftmost position within the first slot 211 and rotate at an angle. The omitted guide portion (not labeled) moves to the rightmost, lowest position within the second slot (not labeled), thus causing the link component 22 in the right side to move to the rightmost position within the first slot 211 and rotate at another angle. Therefore, the two shafts 3 move away from each other and have the maximum axial distance X1 between the shafts 3.

As shown in FIG. 4, the guide portion 222 moves to the rightmost, highest position within the second slot 212, thus causing the link component 22 in the left side to move to the rightmost position within the first slot 211 and rotate at an angle. The omitted guide portion (not labeled) moves to the leftmost, highest position within the second slot (not labeled), thus causing the link component 22 in the right side to move to the leftmost position within the first slot 211 and rotate at another angle. Therefore, the two shafts 3 move toward each other and have the minimum axial distance X2 between the shafts 3.

By the shafts 3 changing the axial distance therebetween while rotating, an electronic device using the hinge assembly 1 (including the joint assembly 12 including the joint components 2) does not buckle when flipping or bending.

For further explanation to the movement of the shafts 3a, 3b, 3c, 3d, and 3e, please refer to FIG. 6A, wherein some components shown in FIG. 6 are omitted for simplicity, such as one of the first plates 21a, one of the second plates 21b, the first link component 22a, the second link component 22b, and the support components 23 of each joint component 2 and the torque generation components 4.

As it is mentioned that the joint component 2b and 2d have the same configuration, therefore, when the fixing bracket 11 which is fixed on the shaft 3e is rotated in a clockwise direction A, the guide portion 222D slides within the second slot 212 from one end 212a to the other end 212b so that the shaft 3e engaged with the first link component to slide within the first slot 211 from one end which is close to the second slot 212 to the other end.

Then, after the shaft 3e abuts the other end of the first slot 211 of the first plates 21a, further exerting on the fixing bracket 11 makes the shaft 3e bring the whole joint component 2d to rotate in clockwise direction A. Then, the rotation of the whole joint component 2d makes shaft 3d slide within the other first slot 211 from one end which is close to the third slot 213 to the other end; meanwhile, the guide portion 222d of the second link component 22b slides within the third slot 213 from one end 213a to the other end 213b.

At this time, the further rotation of the joint component 2d makes shaft 3d move within the corresponding first slot of the joint component 2c from one end to the other end and thus the shaft 3d drives the joint component 2c to rotate in clockwise direction A as well; meanwhile, the guide portion 222C slides within the first slot from one end to the other end.

Then, the further rotation of the joint component 2c makes the shaft 3c and the guide portion 222c slide within the corresponding first slot and the corresponding third slot, respectively. Accordingly, the distance between the shaft 3e and shaft 3d and the distance between the shaft 3d and the shaft 3c are greater than the original ones.

Then, if the joint component 2c is rotated further in the clockwise direction A, then the shaft 3c slides within the corresponding first slot to the rightmost and the corresponding guide portion 222B slides within the second slot from one end 212a to the other end 212b, and at this situation, the distance between the shaft 3b and the shat 3c extends; then the shaft 3c starts to drive the joint component 2b to rotate.

Correspondingly, the rotation of the joint component 2b makes the shaft 3b and the guide portion 222b to slide, and thus the distance between the shaft 3b and the shaft 3c extends farther than what is described in the previous paragraph.

Furthermore, when the shaft 3b moves to the leftmost first slot of the joint component 2b, the further rotation makes the shaft 3b and the guide portion 222A slide within the corresponding first slot and the second slot respectively. At this situation, the distance between the shaft 3b and the shaft 3a becomes farther because this means that the shaft 3b moves to the rightmost first slot of the joint component 2a, which increases the distance between the shaft 3b and the shaft 3a.

Finally, the shaft 3b drives the joint component 2a to rotate in the clockwise direction A, and this makes the shaft 3a and the guide portion 222a slide within the corresponding first slot and the third slot, and thus further increase the distance between the shaft 3b and the shaft 3a.

Figure 7:
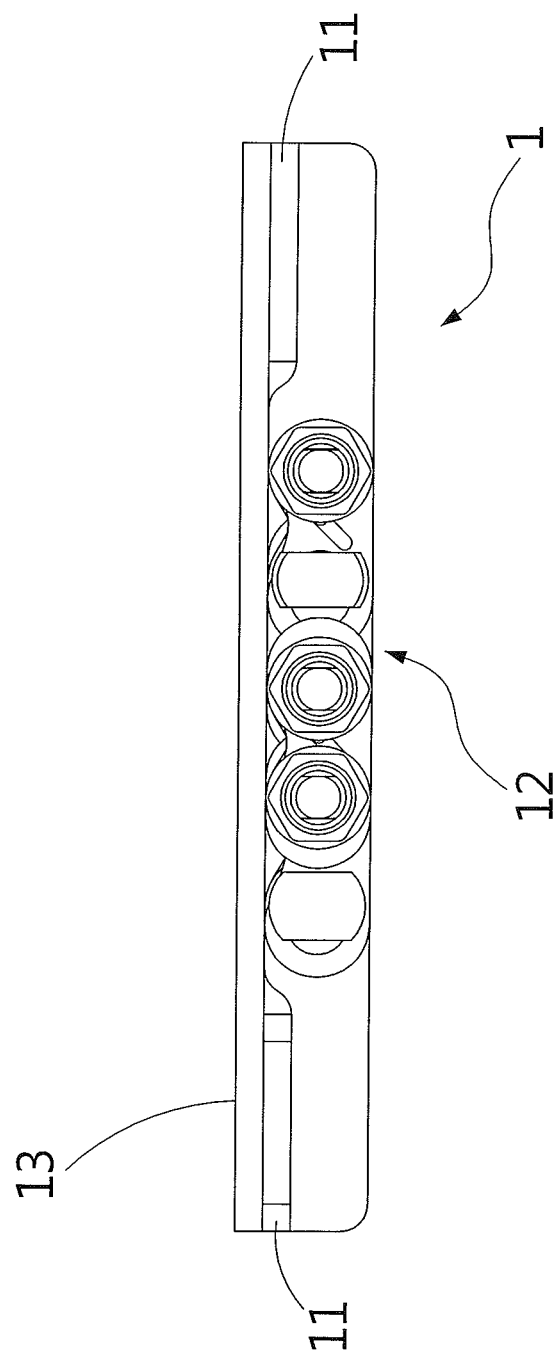
FIG. 7 through FIG. 12 are schematic views illustrating changes of an angle of a hinge assembly according to an embodiment of the present invention.
Figure 8:
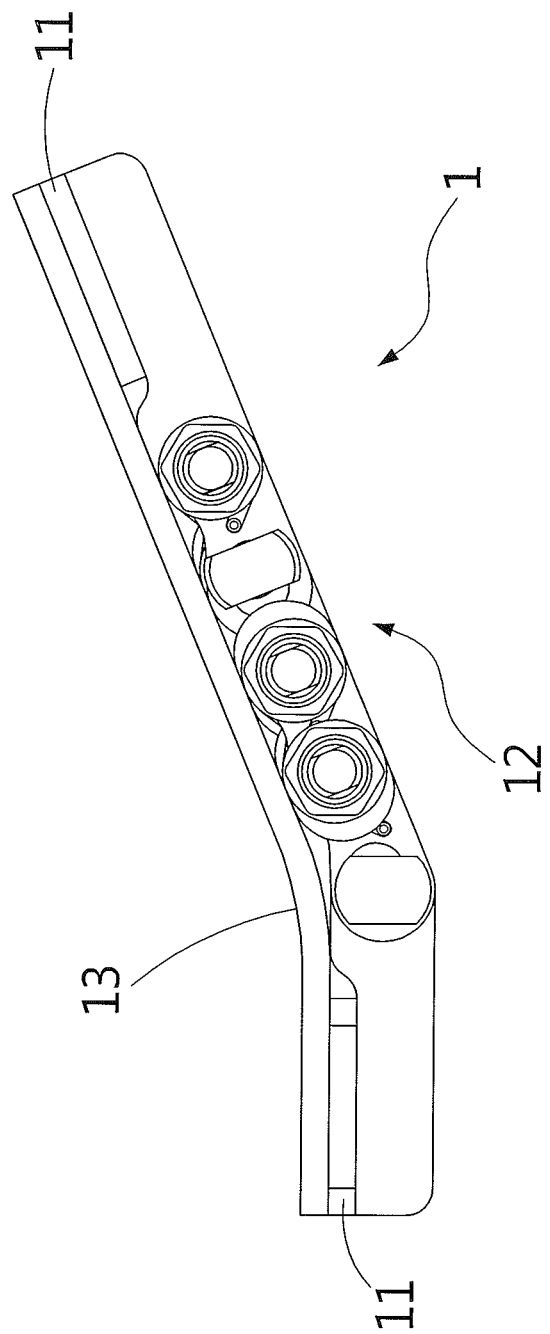
Figure 9:
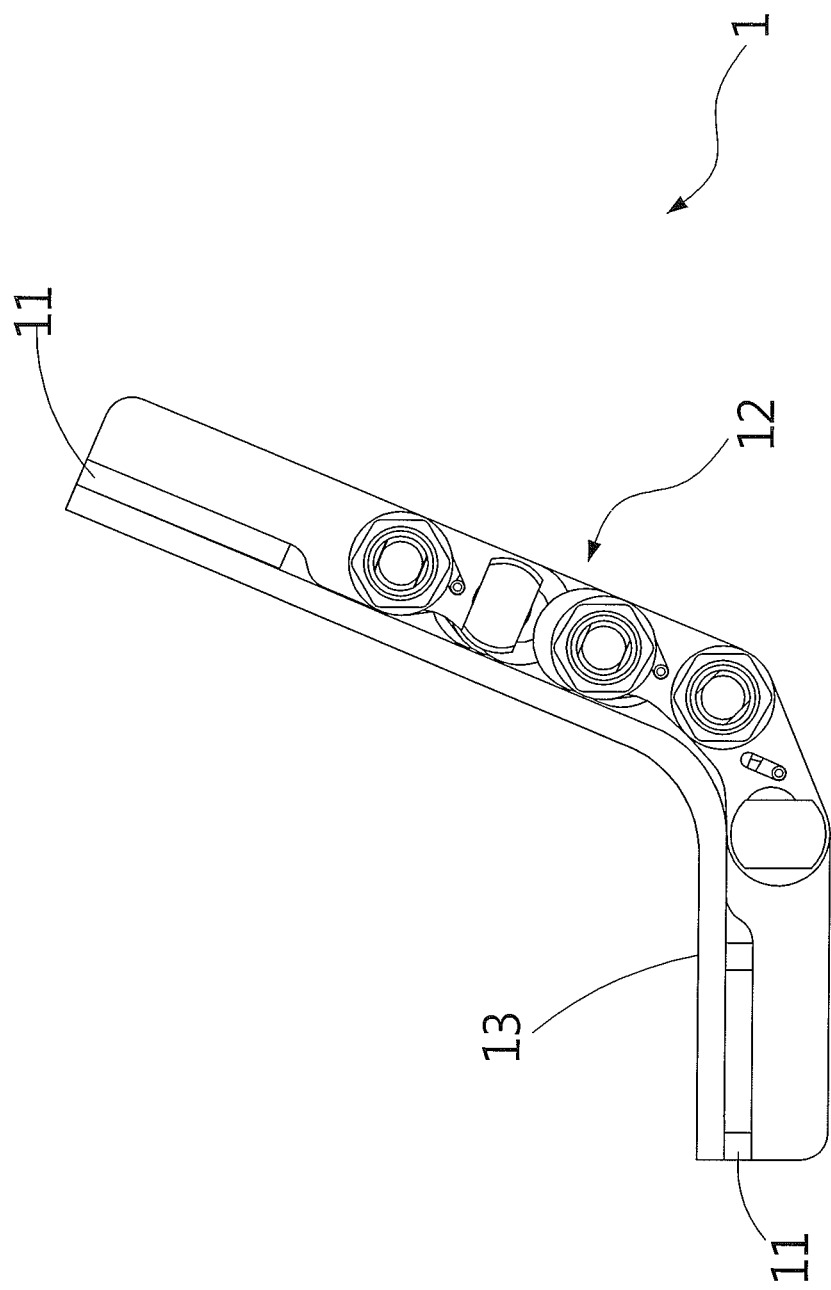
Figure 10:
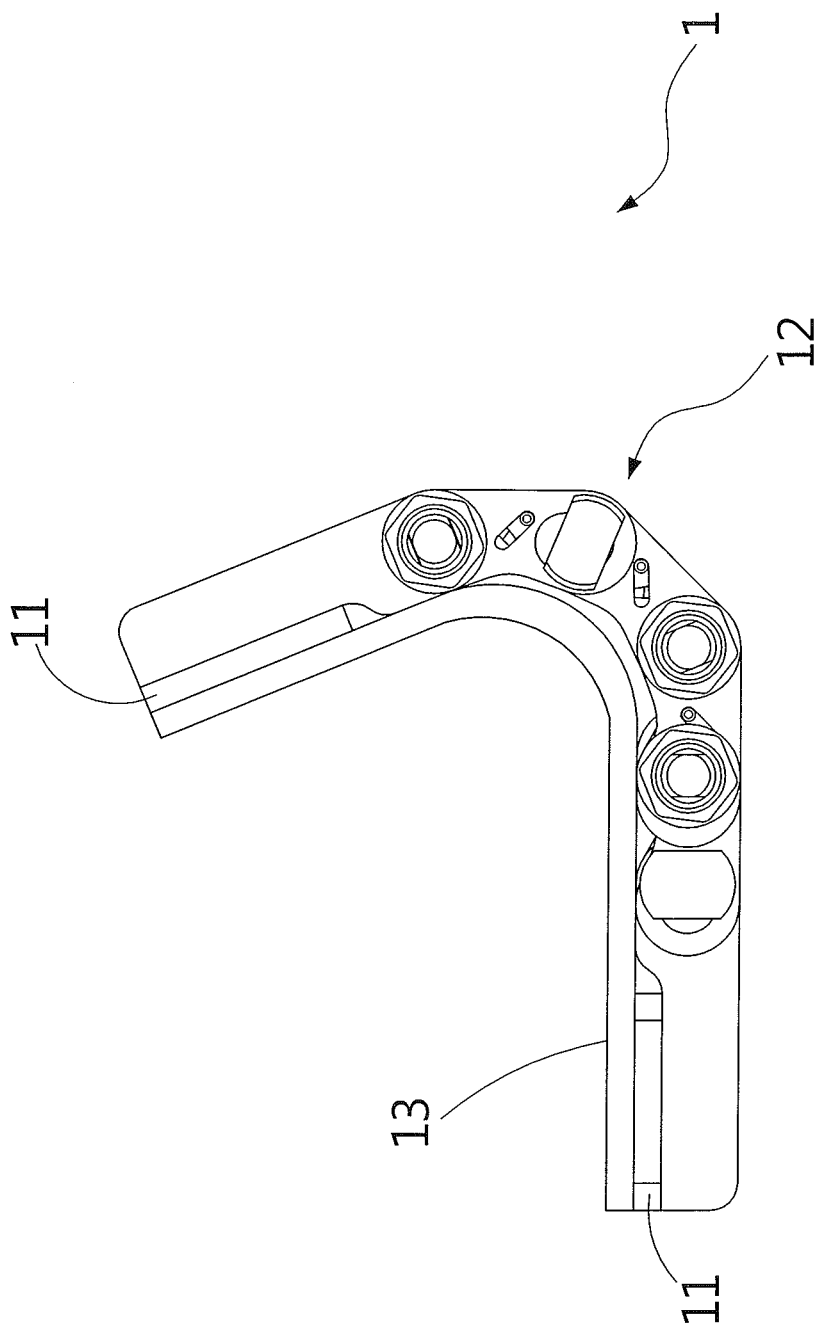
Figure 11:
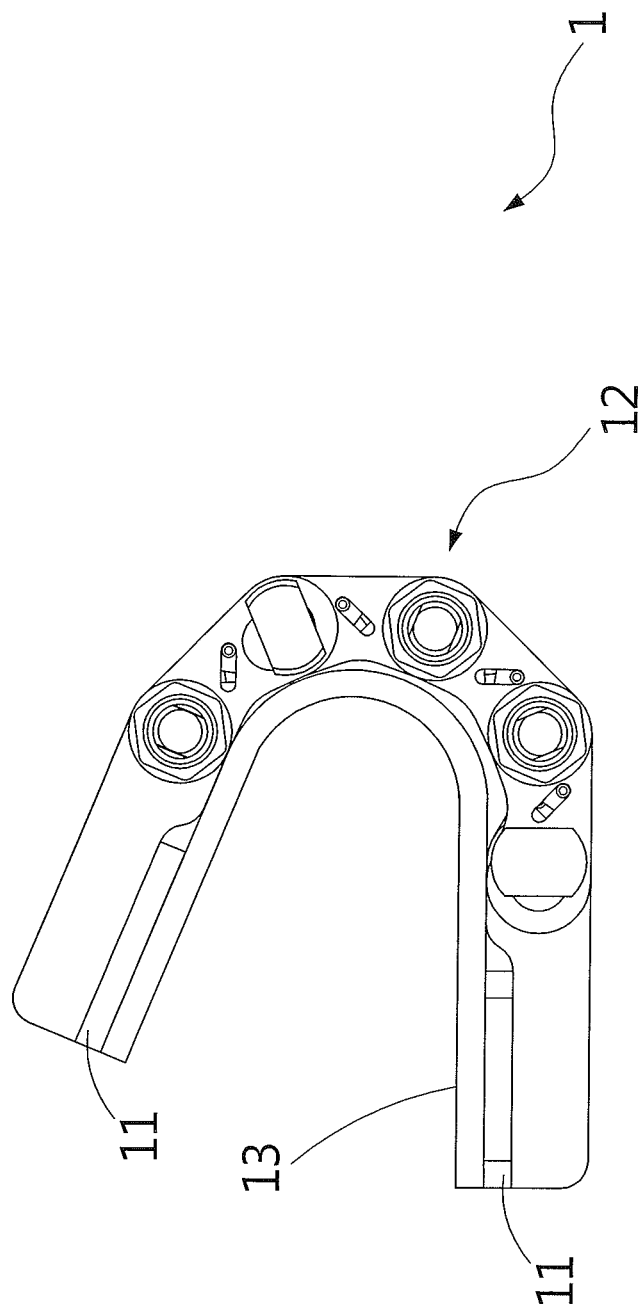
Figure 12:
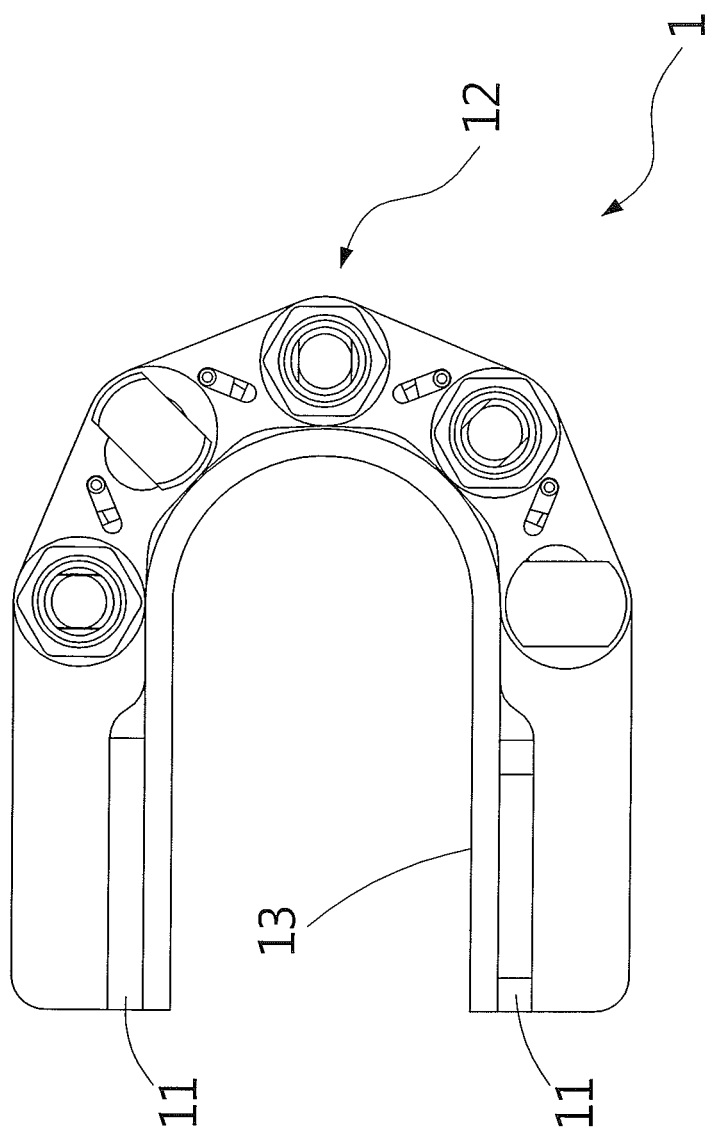

Referring to FIG. 7 through FIG. 12, there are schematic views illustrating changes of an angle of the hinge assembly 1 according to the embodiment of the present invention. The hinge assembly 1 combines with a flexible display 13 by fixing the two fixing brackets 11 to two ends of the flexible display 13, respectively. When the angle of the joint assembly 12 of the hinge assembly 1 changes from 0 degree (as shown in FIG. 7) to 180 degrees (as shown in FIG. 12), the flexible display 13 is forced to bend. By the shafts (not labeled) changing the axial distance therebetween while rotating, a surface of the hinge assembly 1, to which the flexible display 13 is attached, is smooth or has a constant length so that the flexible display 13 does not buckle when bending.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:
1. A hinge assembly comprising:
   a joint assembly comprising a plurality of joint components hinged one by one, wherein each of the plurality of joint components comprises:
   two first plates and two second plates, wherein each of the two first plates and the two second plates has two first slots penetrating therethrough and diametrically extending in a first direction, wherein each of the two first plates has a second slot disposed between the two first slots and diametrically extending in a second direction different from the first direction, wherein each of the two second plates has a third slot disposed between the two first slots and diametrically extending in a third direction mirror-symmetrical to the second direction with respect to the first direction; and
   a first link component disposed between the two first plates and a second link component disposed between the two second plates, wherein each of the first link component and the second link component has an engaging hole and a guide portion, wherein the engaging hole of the first link component corresponds to one of the two first slots of each of the two first plates and the two second plates, and the guide portion of the first link component is formed on a surface of the first link component and movable within the second slot of each of the two first plates, wherein the engaging hole of the second link component corresponds to the other of the two first slots of each of the two first plates and the two second plates, and the guide portion of the second link component is formed on a surface of the second link component and movable within the third slot of each of the two second plates; and a plurality of shafts comprising a first shaft and a second shaft, wherein the first shaft passes through one of the two first slots of each of the two first plates and the two second plates, and the first shaft passes through the engaging hole of the first link component to engage with the first link component, wherein the second shaft passes through the other of the two first slots of each of the two first plates and the two second plates, and the second shaft passes through the engaging hole of the second link component to engage with the second link component, wherein the first shaft and the second shaft rotate in opposite rotating directions, which respectively make the first link component and the second link component rotate, causing the guide portions of the first link component and the second link component to respectively slide within the second slot and the third slot so that the first shaft and the second shaft move inwardly or outwardly;

wherein two of the plurality of joint components hinged together on the same shaft have opposite arrangements of the two first plates and the two second plates, wherein one of the two of the plurality of joint components has the two first plates located in the front thereof and the two second plates located in the rear thereof while the other of the two of the plurality of joint components has the two first plates located in the rear thereof and the two second plates located in the front thereof.

2. The hinge assembly of claim 1, wherein each of the plurality of joint components further comprises two support components, wherein one of the two support components is disposed between the two first plates and the other of the two support components is disposed between the two second plates, wherein each of the two support components has a non-engaging hole corresponding to another of the two first slots of each of the two first plates and the two second plates.

3. The hinge assembly of claim 1, wherein the engaging hole is a non-circular hole, and the plurality of shafts are non-circular shafts corresponding to the engaging hole.

4. The hinge assembly of claim 1, wherein the joint assembly further comprises a plurality of torque generation components respectively disposed at ends of the plurality of shafts.

5. The hinge assembly of claim 1, wherein each of the first link component and the second link component has a body portion and an arm portion extending from a surface of the body portion, wherein the engaging hole is formed in the body portion, and the guide portion is formed on a side of the arm portion.

6. The hinge assembly of claim 5, wherein the arm portion has a through hole, and the guide portion is a cylinder corresponding to the through hole, wherein the guide portion is inserted into the through hole to combine with the arm portion.

7. The hinge assembly of claim 1, further comprising a fixing bracket disposed at a side of the joint assembly for combining the hinge assembly with an electronic device.

8. The hinge assembly of claim 7, wherein the fixing bracket has a fixing structure for fixing the fixing bracket to the electronic device.

\* \* \* \* \*